United States Patent [19]

Lawenhaupt

[11] 4,330,706
[45] May 18, 1982

[54] PHOTOCELL CONTROLLED POWER SUPPLY CIRCUIT FOR AN LED

[75] Inventor: Carl S. G. Lawenhaupt, Malmö, Sweden

[73] Assignee: Aimpoint AB, Malmö, Sweden

[21] Appl. No.: 128,583

[22] Filed: Mar. 10, 1980

[30] Foreign Application Priority Data

Mar. 12, 1979 [SE] Sweden ................................ 7902192

[51] Int. Cl.³ ............................................. H01J 40/14
[52] U.S. Cl. ................................ 250/214 AL; 250/209
[58] Field of Search ..................... 307/311; 250/214 R, 250/206, 214 AL, 214 B, 208, 209, 551, 552; 315/155, 158

[56] References Cited

U.S. PATENT DOCUMENTS

| | | | |
|---|---|---|---|
| 4,117,457 | 9/1978 | Latta | 315/155 |
| 4,121,122 | 10/1978 | Pokrandt | 307/311 |
| 4,140,914 | 2/1979 | Jones | 250/205 |

*Primary Examiner*—David C. Nelms
*Attorney, Agent, or Firm*—Laurence R. Brown

[57] ABSTRACT

A power supply for a light emitting diode (2) is governed by two photo diodes (6,7) each arranged to act upon the base of one of two transistors (3,4) in a darlington connection. One photo diode (6) is adapted to be influenced by low intensity light, whereas the other diode (7) is adapted to be influenced by light of higher intensity.

1 Claim, 1 Drawing Figure

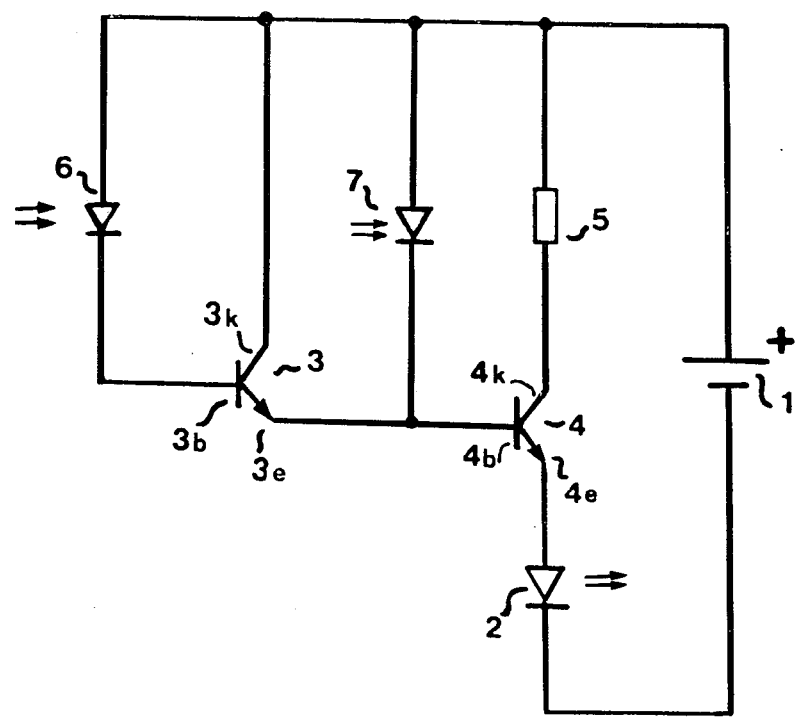

PHOTOCELL CONTROLLED POWER SUPPLY CIRCUIT FOR AN LED

BACKGROUND OF THE INVENTION

1. Field of the Invention

This invention relates to a power supply circuit for a diode adapted to emit light in dependance of the prevailing surrounding light.

2. Description of the Prior Art

It is previously known to design a power supply for a diode comprising a power source and first and second transistors arranged in darlington connection, the base of the first transistor being connected to the power source via a photo cell, the emitter of the second transistor being connected to said diode.

A power supply of this type has been used for a diode applied as an aimpoint in an optical aiming device. This is described in the unpublished Swedish Application No. 7809676-5. Also, U.S. Pat. No. 3,833,799—N. A. Audet—Sept. 3, 1974 is related prior art.

3. Object of the Invention

Although such known circuit fulfills very high requirements regarding adapting the power supply in dependance of the prevailing surrounding light it has been desirable to provide a circuit having an operating range offering between 100 and 1000 times more variation in power than has been possible with the known power supply circuit.

SUMMARY OF THE INVENTION

According to the invention this substantially higher requirement is obtained thereby that said photo cell consists of a photo diode, and that the connection in the darlington connection between the emitter of the first transistor and the base of the second transistor is connected to the power source via a photo diode.

BRIEF DESCRIPTION OF THE DRAWING

The drawing shows a wiring diagram for a power supply circuit according to the invention.

DETAILED DESCRIPTION OF THE EMBODIMENT SHOWN

The reference numeral 1 designates a power supply having a maximum voltage of 2,7 volts. The power supply is used in a circuit consisting of a light diode 2, adapted to emit light in dependance of the prevailing surrounding light. A first transistor 3 having a collector 3k, a base 3b and an emitter 3e and a second transistor 4 having collector 4k, base 4b and emitter 4e have been connected in darlington connection—i.e. the emitter 3e of the first transistor 3 has been connected to the base 4b of the second transistor whereas the emitter 4e of the second transistor has been connected to the negative terminal of the power source 1 in series with the light diode 2. Both transistor collectors 3k and 4k are connected to the positive terminal of the power source—the collector 4k of the transistor 4 in series with a resistance 5. According to the invention two photo diodes 6 and 7 have been series connected in connections between the two bases 3b and 4b of the transistors and the positive terminal of the power source 1.

The photo diode 6 is adapted to be influenced by low intensity surrounding light and supplies the base 3b of the first transistor 3. The emitter 3e now supplies the base 4b and this supply makes the transistor 4 conductive and will cause supply to the light emitting diode 2. The supply is limited by the resistance 5. As soon as the intensity of the surrounding light exceeds a certain limit the supply from the first transistor 3 cannot increase due to a complete exhaust of the amplification. Further supply may now be obtained to the base 4b of the second transistor 4 from the photo diode 7 which is adapted for use during more intense surrounding light.

The second transistor 4 may now cause a further increase in supply to the light emitting diode 2.

I claim:

1. A power supply circuit for controlling emission of a light emitting diode in dependence upon ambient light comprising in combination,
    said light emitting diode,
    a pair of transistors arranged in a darlington connection with a base input an emitter output connected to drive said light emitting diode and an emitter to base connection between the transistors,
    a power source having a first of two terminals connected to the darlington pair through said light emitting diode,
    and a pair of photo responsive diodes, one connecting said base to the second power source terminal and the other connecting the emitter to base connection between the transistors to the second power source terminal.

* * * * *